United States Patent
Hsu et al.

(10) Patent No.: US 8,178,422 B2
(45) Date of Patent: May 15, 2012

(54) METHOD OF MEASUREMENT IN SEMICONDUCTOR FABRICATION

(75) Inventors: Alex Hsu, Hsinchu (TW); Shih-Chi Fu, Taipei (TW); Feng-Jia Shiu, Jhudong Township, Hsinchu County (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 181 days.

(21) Appl. No.: 12/415,005

(22) Filed: Mar. 31, 2009

(65) Prior Publication Data
US 2010/0244287 A1    Sep. 30, 2010

(51) Int. Cl.
  H01L 21/76 (2006.01)
  H01L 21/00 (2006.01)
  H01L 23/544 (2006.01)
(52) U.S. Cl. . 438/462; 438/401; 257/797; 257/E31.001; 257/E31.124; 257/E31.127
(58) Field of Classification Search .......... 438/60, 438/69, 72, 75, 401, 462; 257/431, 432, 257/436, 437, 797, 31.001, E31.124, E31.127 E
See application file for complete search history.

(56) References Cited

U.S. PATENT DOCUMENTS

| | | | |
|---|---|---|---|
| 4,374,700 A * | 2/1983 | Scott et al. | 438/586 |
| 5,598,016 A * | 1/1997 | Tanabe et al. | 257/229 |
| 2004/0075179 A1* | 4/2004 | Liu et al. | 257/797 |
| 2004/0166696 A1* | 8/2004 | Lee | 438/792 |
| 2006/0094151 A1* | 5/2006 | Sumi | 438/57 |
| 2006/0170099 A1* | 8/2006 | Livengood et al. | 257/734 |
| 2006/0180815 A1* | 8/2006 | Sarma et al. | 257/66 |
| 2009/0117680 A1* | 5/2009 | Yamazaki et al. | 438/57 |
| 2009/0140365 A1* | 6/2009 | Lee et al. | 257/460 |
| 2010/0148289 A1* | 6/2010 | McCarten et al. | 257/432 |

* cited by examiner

*Primary Examiner* — Michael Lebentritt
*Assistant Examiner* — Karen Kusumakar
(74) *Attorney, Agent, or Firm* — Haynes and Boone, LLP (57) ABSTRACT

Provided is a method of fabricating a semiconductor device. The method includes providing a device substrate having a front side and a back side, the device substrate having a first refractive index, forming an embedded target over the front side of the device substrate, forming a reflective layer over the embedded target, forming a media layer over the back side of the device substrate, the media layer having a second refractive index less than the first refractive index, and projecting radiation through the media layer and the device substrate from the back side so that the embedded target is detected for a semiconductor process.

20 Claims, 8 Drawing Sheets

METHOD OF MEASUREMENT IN SEMICONDUCTOR FABRICATION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

To manufacture semiconductor devices, it is crucial to have precise alignment between a photomask and a wafer during a photolithography process as well as satisfactory overlay between various layers in the semiconductor device. Alignment or overlay marks have been used to measure and adjust the alignment or overlay. The alignment and/or overlay marks may be embedded in the semiconductor device. For some semiconductor devices, it may be difficult for the alignment or overlay mark to be detected during processing. For example, a back-side illuminated image sensor device utilizes an array of pixels to sense radiation (such as light) projected towards a backside of a semiconductor wafer. The sensed radiation is converted into electrical signals, which may be used to define an image. In order to successfully process the backside of the wafer, the embedded alignment or overlay marks need to be accurately detected from the backside of the wafer. However, the detected images of the alignment or overlay marks often times are not sharp or clear enough to meet alignment or overlay requirements of a semiconductor fabrication process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

One of the broader forms of the present disclosure involves a method of fabricating a semiconductor device that includes: providing a device substrate having a front side and a back side, the device substrate having a first refractive index; forming an embedded target over the front side of the device substrate; forming a reflective layer over the embedded target; forming a media layer over the back side of the device substrate, the media layer having a second refractive index less than the first refractive index; and projecting radiation through the media layer and the device substrate from the back side so that the embedded target is detected for a semiconductor process.

Another of the broader forms of the present disclosure involves a semiconductor device that includes: a device substrate having a front side and a back side, the device substrate having a first refractive index; an embedded target formed over the front side of the device substrate; a reflective layer formed over the embedded target, the reflective layer being capable of reflecting radiation projected from the back side of the device substrate; and a media layer formed over the back side of the device substrate, the media layer having a second refractive index less than the first refractive index.

Still another of the broader forms of the present disclosure involves a method of fabricating a semiconductor device that includes: providing a device substrate having a front side and a back side, the device substrate having a first refractive index and a scribe line region; forming an embedded mark in a gate layer over the front side of the device substrate, the embedded mark being formed within the scribe line region; forming a reflective layer within an interconnect structure; bonding a carrier substrate to the front side of the device substrate; thinning the device substrate from the back side; forming a media layer over the back side of the thinned device substrate, the media layer having a second refractive index less than the first refractive index and greater than a refractive index of air; and projecting radiation through the media layer and the device substrate from the back side so that the embedded mark is detected for a semiconductor process.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
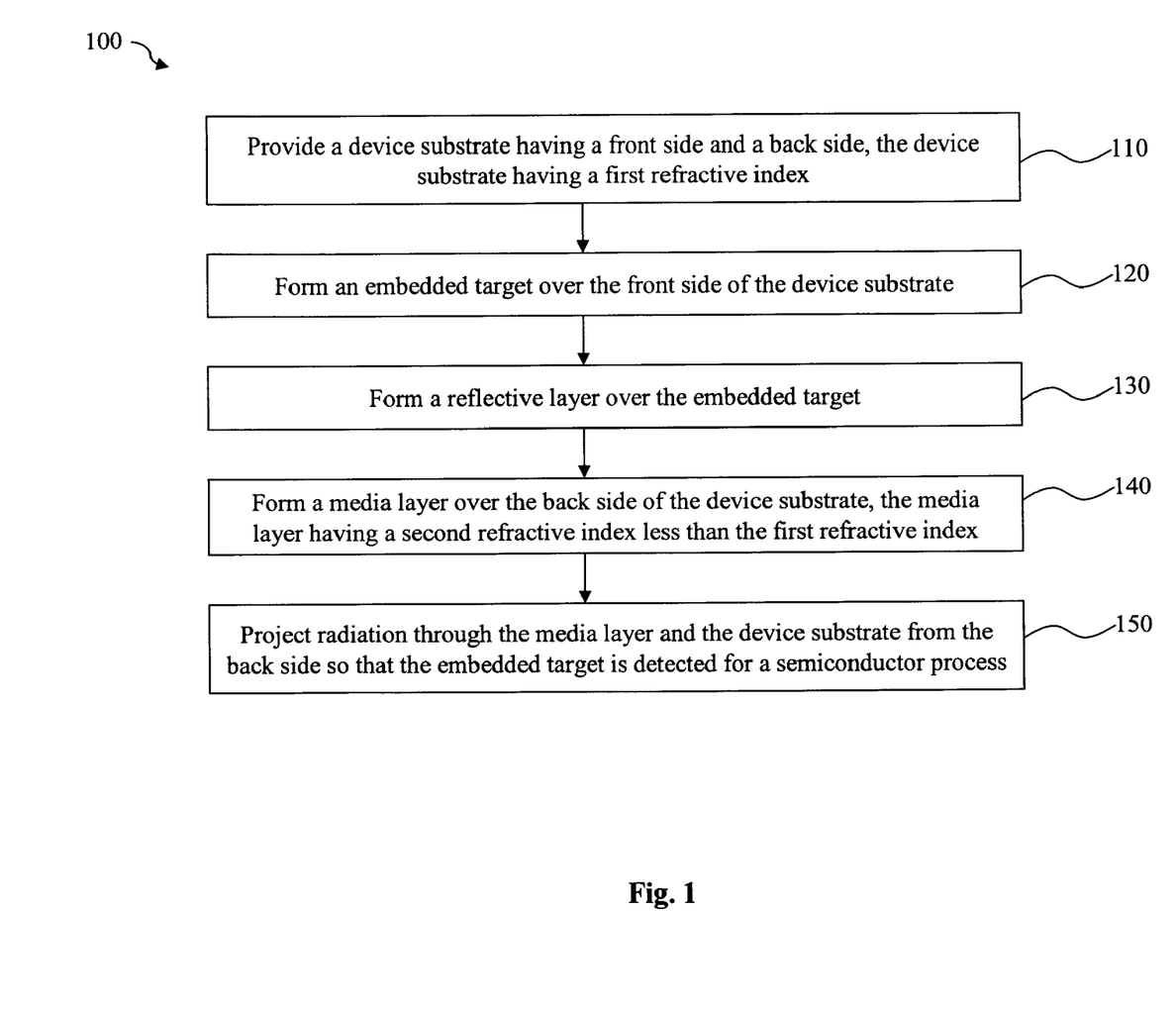
FIG. 1 is a flowchart illustrating a method for fabricating a semiconductor device according to various aspects of the present disclosure.

Illustrated in FIG. 1 is a flowchart of a method 100 of fabricating a semiconductor device according to various aspects of the present disclosure. FIGS. 2A to 2G are cross-sectional views of one embodiment of a semiconductor device 200 at various stages of fabrication according to the method 100 of FIG. 1. For the sake of example, the semiconductor device 200 shown in FIGS. 2A to 2G is a back-side illuminated (BSI) image sensor device. The BSI image sensor device 200 includes an array or grid of pixels for sensing and recording an intensity of radiation directed towards a backside of the image sensor device 200. The image sensor device 200 may also include a charge-coupled device (CDD), complimentary metal oxide semiconductor (CMOS) image sensor (CIS), an active-pixel sensor (APS), and a passive-pixel sensor. The image sensor device 200 may further include additional circuitry and input/outputs that are provided adjacent to the grid of pixels for providing an operation environment for the pixels and for supporting external communication with the pixels. It is understood that FIGS. 2A-2G have been simplified for a better understanding of the inventive concepts of the present disclosure.

Referring to FIG. 1, the method 100 begins with block 110 in which a device substrate having a front side and a back side is provided. The device substrate has a first refractive index. The method 100 continues with block 120 in which an embedded target is formed over the front side of the device substrate. The method 100 continues with block 130 in which a reflective layer is formed over the embedded target. The method 100 continues with block 140 in which a media layer is formed over the back side of the device substrate. The media layer has a second refractive index that is less than the first refractive index. The method 100 continues with block 150 in which radiation is projected through the media layer and the device substrate from the back side so that the embedded target is detected for a semiconductor process.

Figure 2A:
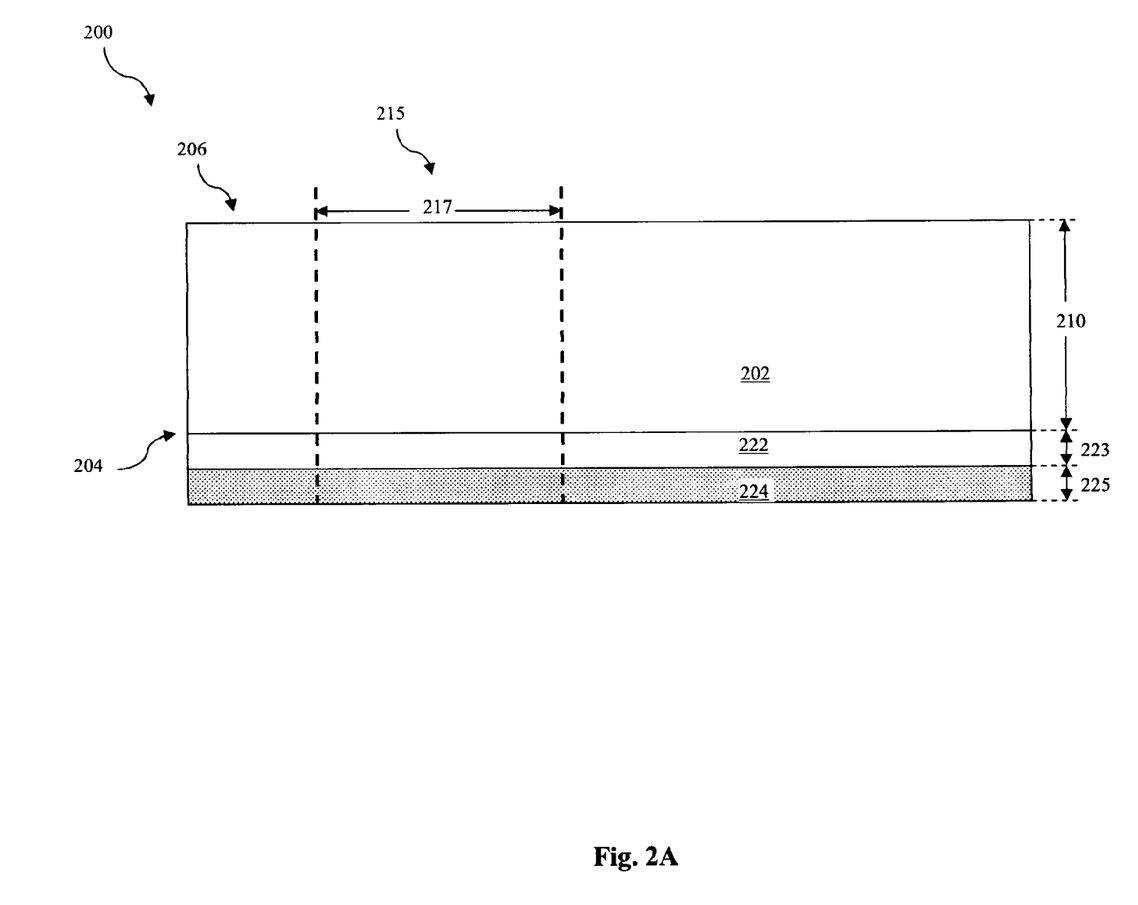
FIGS. 2A-2G are cross-sectional views of a semiconductor device at various stages of fabrication according to the method of FIG. 1.

Referring to FIG. 2A, illustrated is the image sensor device 200 that includes a substrate 202 having a front side (or front surface) 204 and a backside (or back surface) 206. In the present embodiment, the substrate 202 is a silicon substrate doped with either a P-type dopant such as boron (e.g., P-type substrate) or an N-type dopant such as phosphorous (e.g., N-type substrate). In other embodiments, the substrate 202 includes other elementary semiconductors such as germanium and diamond. Alternatively, the substrate 202 may optionally include a compound semiconductor and/or an alloy semiconductor. Further, the substrate 202 may include an epitaxial layer (epi layer), may be strained for performance enhancement, and may include a silicon-on-insulator (SOI) structure. The substrate 202 may also include semiconductor circuits. In the present embodiment, the substrate 202 includes a plurality of pixels having doped radiation sensing regions. The radiation sensing regions are operable to detect radiation, such as light, projected towards the back side 206 of the substrate 202. The images associated with the radiation are converted into electrical signals by the radiation sensing regions. The pixels in the substrate 202 may also have isolation structures to isolate the pixels from each other to reduce noise interference between the pixels. Since the substrate 202 includes semiconductor devices such as pixels, it may also be referred to as a device substrate 202. The device substrate 202 has an initial thickness 210 that ranges from about 100 um to about 1000 um. In the present embodiment, the initial thickness 210 is about 750 um.

It is understood that the device substrate 202 may absorb radiation as radiation passes through the device substrate 202. The amount of radiation absorption may depend on the material composition as well as the thickness 210 of the substrate 202. The amount of radiation absorption also determines a transparency level of the device substrate 202. Thus, the level of transparency of the device substrate 202 may vary depending on the thickness 210 of the device substrate 202. Generally, the thicker the device substrate 202, the less transparent it becomes. It has been observed that even at relatively thin levels, the device substrate 202 is not completely transparent. The lack of good transparency of the device substrate 202 may cause difficulties for detecting alignment or overlay marks that may be located below the device substrate 202. This will be discussed in detail later on.

The integrated circuit devices on the device substrate 202, such as the pixels in the present embodiment, may be separated into various dies that will be packaged to produce integrated circuit (IC) chips. To separate the dies, a plurality of scribe line regions may be provided between adjacent dies so that the dies can be separated without damaging the integrated circuits during processing. For the sake of illustration and simplicity, one such scribe line region 215 in the device substrate 202 is shown in FIG. 2A. The boundaries of the scribe line region 215 are denoted by the dashed lines. The scribe line region 215 has a width 217. In the present embodiment, the width 217 of the scribe line region 215 is in a range from about 40 um to about 160 um, for example about 80 um.

A gate dielectric layer 222 is formed on the front side 204 of the device substrate 202. In the present embodiment, the gate dielectric layer 222 includes silicon oxide. In an alternative embodiment, the gate dielectric layer 222 includes a high-K material such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or combinations thereof. The gate dielectric layer 222 may be formed by atomic layer deposition (ALD) or other suitable techniques known in the art. The gate dielectric layer 222 has a thickness 223 that is in a range from about 10 Angstroms to about 60 Angstroms.

A gate electrode layer 224 is formed on the gate dielectric layer 222. In the present embodiment, the gate electrode layer 224 includes polysilicon. In an alternative embodiment, the gate electrode layer 224 includes a work function metal such as titanium nitride (TiN) or tantalum nitride (TaN) and a conductive material such as aluminum (Al), copper (Cu), tungsten (W), nickel (Ni), or combinations thereof. The gate electrode layer 224 may be formed by various deposition techniques such as physical vapor deposition (PVD), chemical vapor deposition (CVD), atomic layer deposition (ALD), plating, or other suitable techniques known in the art. The gate electrode layer 224 has a thickness 225 that is in a range from about 1000 Angstroms to about 4000 Angstroms.

Figure 2B:
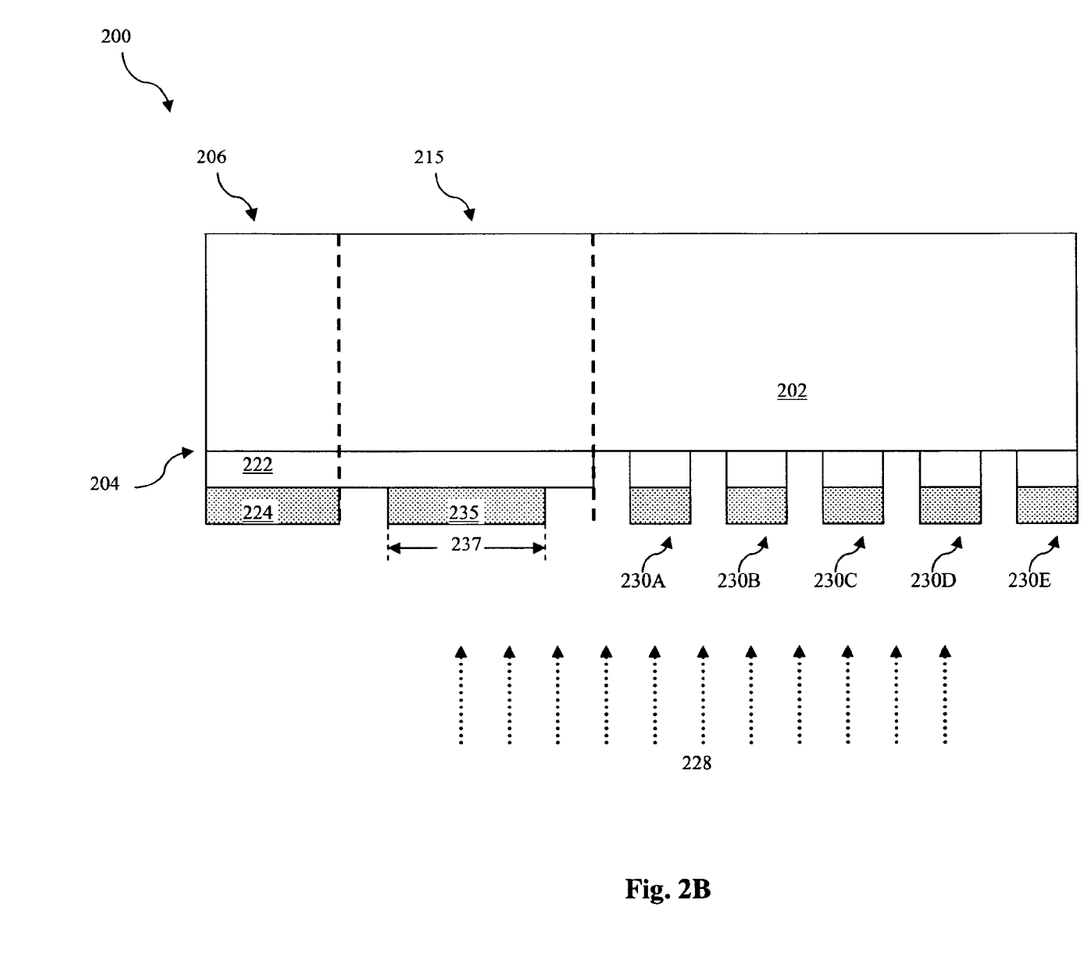

Referring now to FIG. 2B, the gate dielectric layer 222 and the gate electrode layer 224 are patterned by a patterning process 228 to form gates 230A-230E of transistor devices in the device substrate 202. The patterning process 228 may involve one or more photolithography and etching processes to form the patterned gates 230A-230E. In the present embodiment, the patterning process 228 also patterns a portion of the gate electrode layer 224 to form a target 235, which may also be referred to as a mark. The mark 235 represents a mark that needs to be detected in subsequent processing. The detection of the mark 235 involves a detection process that is discussed in more detail later. The mark 235 is formed within the scribe line region 215 in the present embodiment. In alternative embodiments, the mark 235 may be formed outside the scribe line region 215. The mark 235 has a size 237 that is less than the width 217 of the scribe line region 215. In the present embodiment, the size 237 of the mark 235 is in a range from about 20 um to about 80 um, for example about 40 um.

The mark 235 may be used to provide alignment in subsequent processing. For example, in a photolithography process, a photomask may be used to transfer an image pattern onto a semiconductor wafer. The photomask has an alignment mark, and the semiconductor wafer has another alignment mark. To ensure that the alignment between the photomask and the semiconductor wafer meets the fabrication requirements, an automated machine or an operator may shift (or move) the photomask in a translational mode (in an X-direction or a Y-direction) or a rotational mode with respect to the semiconductor wafer so that the alignment mark on the photomask aligns with the alignment mark on the wafer. This is referred to as an alignment process. Similarly, an overlay process is used to ensure that the alignment (referred to as overlay) among the different layers within a semiconductor wafer are sufficient to meet fabrication requirements. In an overlay process, one or more overlay marks are included in the layers that are sensitive to overlay errors. For example, a layer that is sensitive to overlay errors may have overlay marks in a center region and the corner regions of the layer. The overlay marks in each layer are tuned to be aligned with their corresponding overlay marks (above or below) in other layers. In both the alignment process and the overlay process, the process where an automated machine or an operator moves one mark to align with other marks is referred as a registration process. For example, a registration process may include moving a first overlay mark with respect to the second overlay mark until the first overlay mark is substantially above the center of a second overlay mark.

Figure 2C:
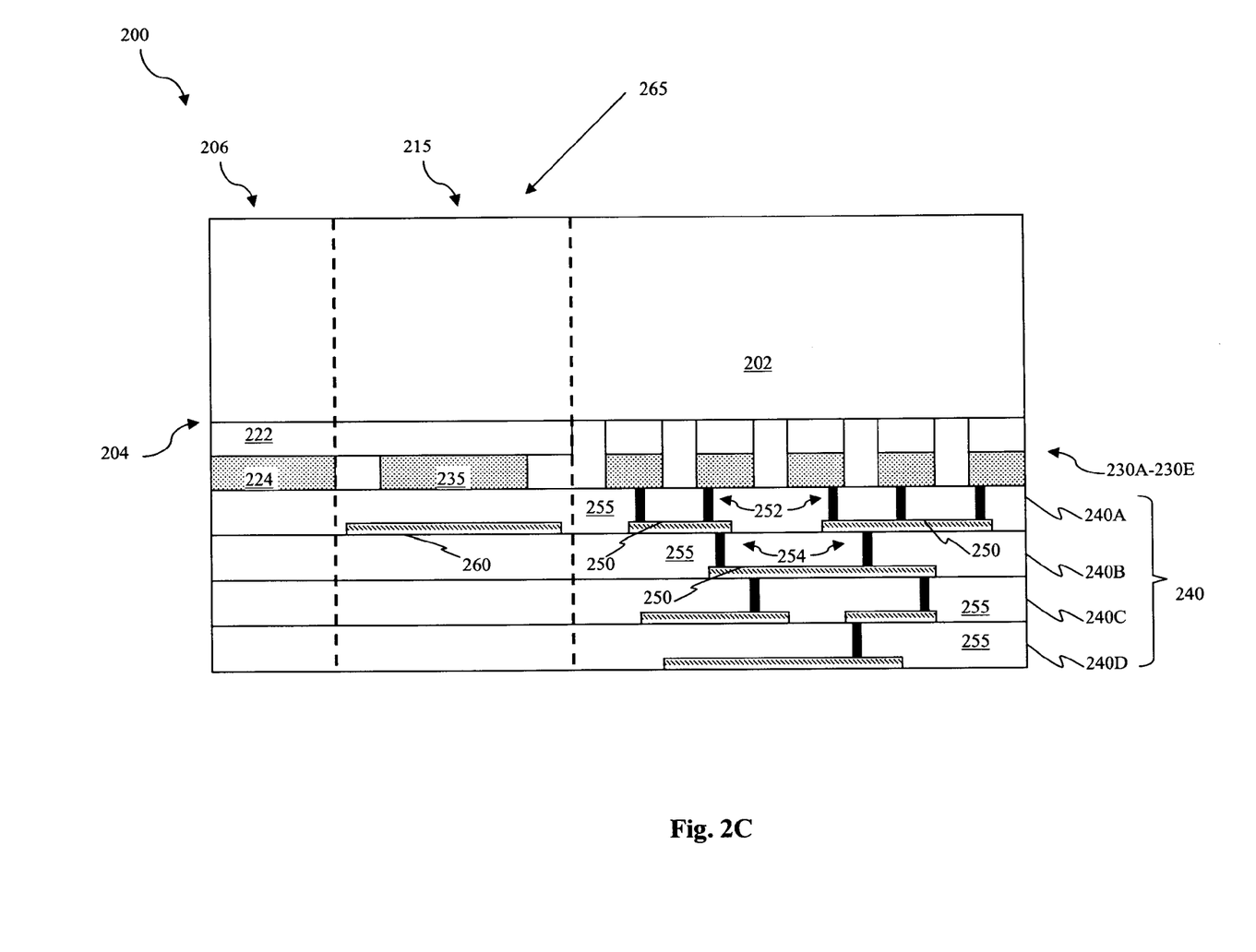

It is understood that various processes are performed to complete formation of the various integrated circuit devices (e.g., photodiodes, transistors, resistors, capacitors, etc.) of the image sensor device 200. Referring now to FIG. 2C, an interconnect structure 240 is formed over the front side 204 of the device substrate 202. The interconnect structure 240 includes a plurality of layers (referred to as metal layers M1, M2, M3, etc.) that provide interconnections (e.g., wiring) between the various doped features, circuitry, and input/output features of the image sensor device 200. For the sake of illustration, layers 240A-240D are shown in FIG. 2C. Each of the layers 240A-240D includes conductive lines, for example, conductive lines 250 in layer 240A and layer 240B. In one embodiment, the interconnect structure 240 is an aluminum interconnect structure. For an aluminum interconnect structure 240, the conductive lines 250 includes aluminum, aluminum/silicon/copper alloy, titanium, titanium nitride, tungsten, polysilicon, metal silicide, or combinations thereof. The conductive lines 250 may be formed by a process including physical vapor deposition (PVD) (or sputtering), chemical vapor deposition (CVD), or combinations thereof. In another embodiment, the interconnect structure 240 is a copper interconnect structure. For a copper interconnect structure 240, the conductive lines 250 includes copper, copper alloy, titanium, titanium nitride, tantalum, tantalum nitride, tungsten, polysilicon, metal silicide, or combinations thereof. The conductive lines 250 may be formed by a process including CVD, sputtering, plating, or other suitable processes.

Each of the layers 240A-240D also includes a dielectric material 255 (referred to as inter-metal dielectric). The dielectric material 255 includes silicon oxide in the present embodiment. In other embodiments, the dielectric material 255 may include fluorosilicate glass (FSG), low-k materials, or combination thereof. The low-k material can be defined as a dielectric material having its dielectric constant less than 3.9, that of a thermal silicon oxide. The low-k materials may comprises carbon-doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials.

The layer 240A of the interconnect structure 240 also includes contacts 252 that provide electrical connections between the interconnect structure 240 and other transistor devices in the image sensor device 200, for example, the gates 230A-230E. Each of the contacts 252 may be formed by etching a trench that extends through the dielectric material 255 in the layer 240A using a photolithography process, and then filling the trench with a conductive material such as metal. In the present embodiment, the conductive material in the contacts 252 includes tungsten. The layers 240B-240D also include vias 254 that provide electrical connections between the layers 240B-240D. The vias 254 are formed using a method similar to the method used to form the contacts 254 and include trenches filled with a conductive material as well. In the present embodiment, the conductive material in the vias 254 includes tungsten, copper, titanium, titanium nitride, or combinations thereof. Note that the dielectric material 255 in each of the layers 240A-240D serve to electrically isolate the conductive lines 250, the contacts 252, and the vias 254 in the interconnect structure 240.

In the present embodiment, the processing steps used to form the conductive lines 250 are also used to form a reflective layer 260 in the interconnect structure 240. The reflective layer 260 is embedded in the interconnect structure and includes a material having good reflectivity, so that it may serve as a mirror-like device and reflect back a radiation 265 projected from the back side 206 of the image sensor device 200. (For the sake of simplicity, the radiation 265 is referred to as the light 265 thereafter). As is illustrated in FIG. 2C, the reflective layer 260 is formed in the first layer 240A of the interconnect structure 240 and includes a material substantially the same as the material of the conductive lines 250. The reflective layer 260 is also formed below the mark 235 and within the scribe line region 215. In alternative embodiments, the reflective layer 260 may be formed in other layers 240B-240C of the interconnect structure 240 and may be formed outside the scribe line region 215 (such as under one or more of the gates 230A-230E).

The reflective layer 260 in the present embodiment offers several advantages. One advantage is that the reflective layer 260 makes the detection of the mark 235 easier. Generally, for an object to be optically detected, it needs to either emit light by itself or reflect light, and the emitted or reflected light needs to be detected by a light detecting apparatus. In the present embodiment, the mark 235 does not emit light. Thus, the detection of the mark 235 involves a portion of the light 265 being reflected back by the mark 235. As the light 265 (projected from the back side 206 of the device substrate 202) travels through the image sensor device 200, a portion of the light 265 may be absorbed by the various materials of the image sensor device 200, such as silicon, which does not have a good transparency level. The absorption of the light 265 lessens the intensity of the light reflected back by the mark 235, which in turn increases the difficulty of detecting the mark 235. However, the reflective layer 260 also reflects back a portion of the light 265. Thus, the overall intensity of the reflected light increases, in part due to the addition of the reflective layer 260. As a result, the pattern or image of the mark 235 has an enhanced clarity and sharpness in the present embodiment. Another advantage of the present embodiment is that the reflective layer 260 is formed by the same processing steps that form the layers 240A-240D, so no additional processing steps are needed to form the reflective layer 260.

Although not shown in the figures, it is understood that the semiconductor device 200 also includes at least one etch stop layer. For example, an etch stop layer may be disposed at an interface between the device substrate 202 and the layer 240A of the interconnect structure 240. The etch stop layer may comprise a material selected from the group consisting of silicon nitride, silicon oxynitride, silicon carbide, and other proper materials.

Figure 2D:
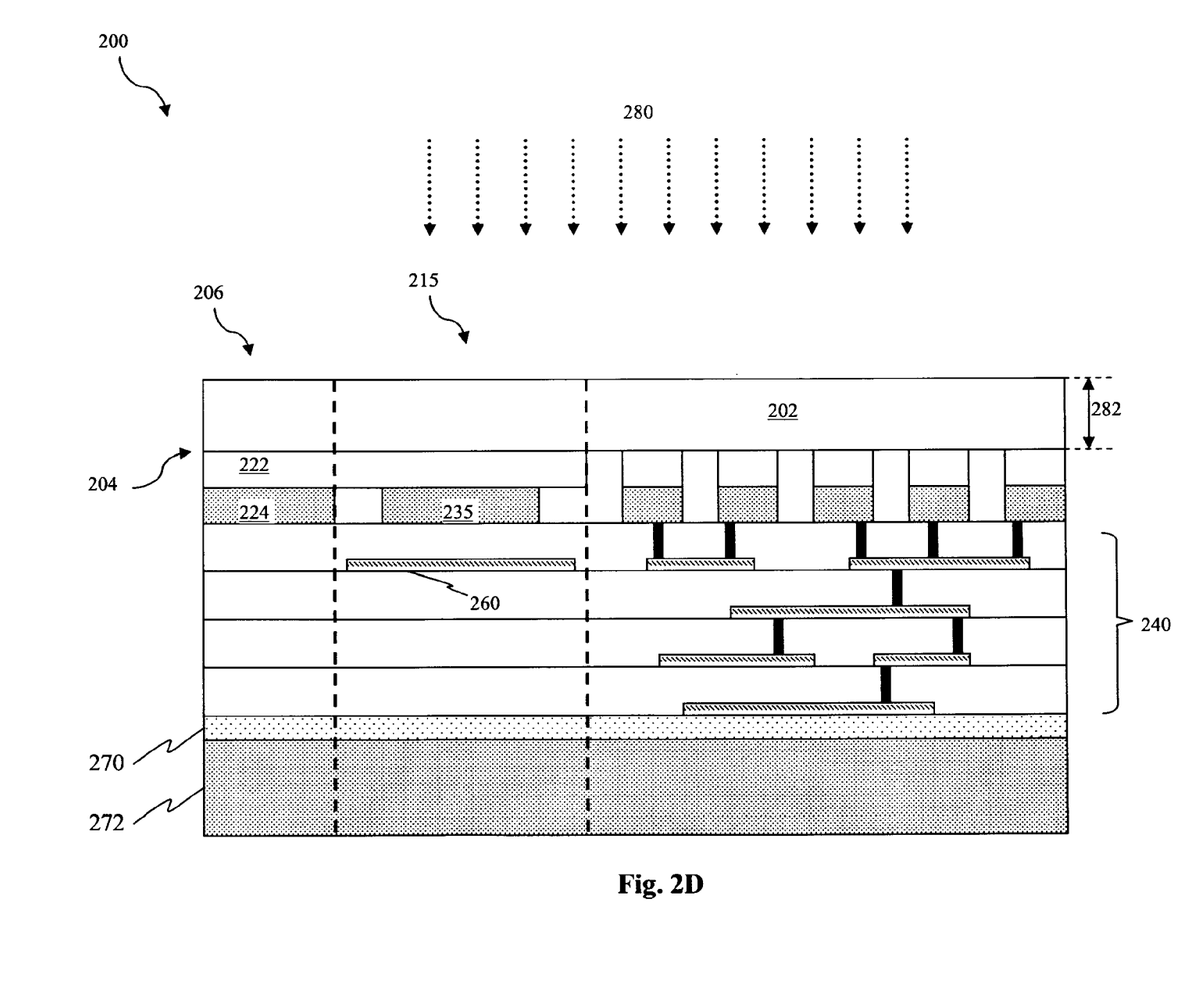

Referring now to FIG. 2D, a buffer layer 270 is formed over the interconnect structure 240. In the present embodiment, the buffer layer 270 includes a dielectric material such as silicon oxide. The buffer layer 270 may also optionally include silicon nitride. The buffer layer 270 is formed by CVD, PVD, or other suitable techniques. The buffer layer 270 is also planarized to form a smooth surface so that the buffer layer 270 has better bonding properties. The planarization may be done using a chemical mechanical polishing (CMP) process or another suitable technique known in the art.

Next, a carrier substrate 272 is bonded with the smoothed surface of the buffer layer 270 so that processing the backside 206 of the device substrate 202 can be performed. In the present embodiment, the carrier substrate 272 is bonded to the buffer layer 270 by molecular forces—a technique known as direct bonding or optical fusion bonding, which requires smooth and flat bonding surfaces (hence the reason for polishing the surface of the buffer layer 270). In other embodiments, the carrier substrate 272 may be bonded to the buffer layer 270 by techniques such as metal diffusion or anodic bonding known in the art. The carrier substrate 272 may be similar to the device substrate 202 and includes a silicon material. Alternatively, the carrier substrate 272 may optionally include a glass material. The carrier substrate 272 provides protection for the various features (such as pixels) formed in the device substrate 202, and also provides mechanical strength and support for processing the backside 206 of the substrate 202 as discussed below. It is noted that, in addition to providing a smooth and flat surface for bonding with the carrier substrate 272, the buffer layer 270 also provides electrical isolation between the device substrate 202 and the carrier substrate 272.

After bonding, the device substrate 202 and the carrier substrate 272 may optionally be annealed to enhance the bonding strength. Afterwards, a thinning process 280 is performed to thin the device substrate 202 from the backside 206. The thinning process 280 may include a mechanical grinding step and a chemical thinning step. A substantial amount of substrate material may be removed from the device substrate 202 during the mechanical grinding step. Thereafter, the chemical thinning step may apply an etching chemical to the back side 206 to further thin the device substrate 202 to a thickness 282. In the present embodiment, the thickness 282 is within a range from about 1.5 um to about 2.5 um. It is also understood that the particular thicknesses disclosed herein are mere examples and that other thicknesses may be implemented depending on the type of application and design requirements of the image sensor device 200.

Figure 2E:
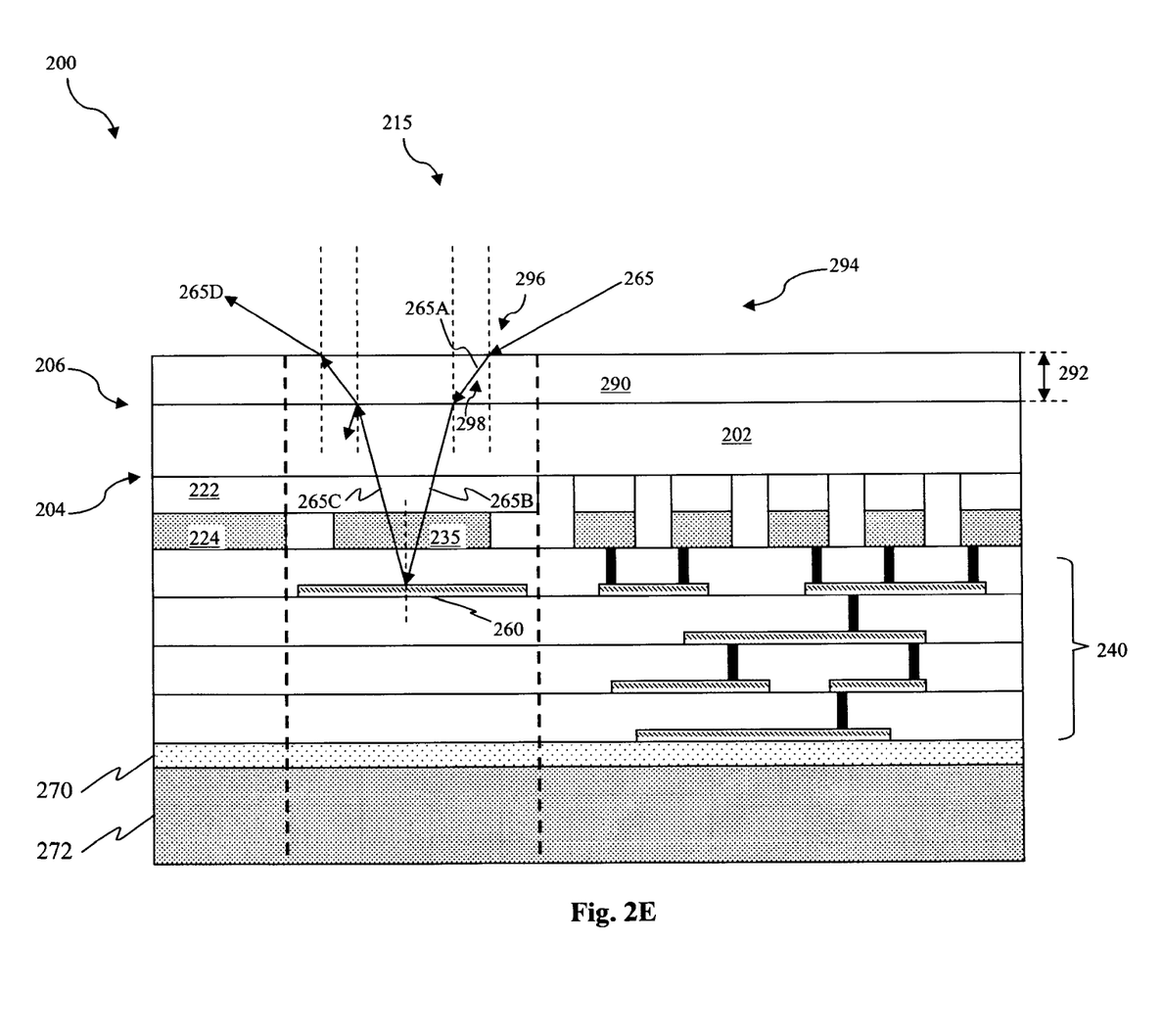

Referring now to FIG. 2E, a media layer 290 is formed on the back side 206 of the device substrate 202. In the present embodiment, the media layer 290 is a backside-antireflective (BARC) layer and includes an ultra-violet silicon nitride material and an oxide material. The ultra-violet silicon nitride material has a thickness of about 270 Angstroms, and the oxide material has a thickness of about 100 Angstroms. Thus in the present embodiment, the media layer 290 has a thickness 292 of about 370 Angstroms (the sum of the thicknesses of the ultra-violet silicon nitride material and the oxide material). The media layer 290 may be formed by CVD, PVD, or other suitable techniques known in the art.

The media layer 290 includes a refractive index. In general, the refractive index of a medium measures how much the speed of a wave—such as light or sound—is reduced when it is propagating (traveling) inside the medium in comparison to the speed of the wave propagating in a vacuum. For example, if a medium has a refractive index value of 2 for light, then light in the medium propagates at ½=0.5 times the speed of light in a vacuum. The refractive index value for a particular medium is also dependent on the wavelength or frequency of the wave. For the sake of simplicity and illustration, the refractive index values discussed herein refer to the refractive index values of the respective media with respect to visible light. It is also known in the art that when a wave (such as light) propagates from a first medium to a second medium, the wave's angle of incidence changes if the two media have different refractive index values. The relationship between the refractive indexes values of the respective media and the respective angles of incidence is governed by Snell's law of refraction: refractive index value of medium 1* sine(angle of incidence 1)=refractive index value of medium 2*sine(angle of incidence 2).

For example, in the present embodiment, the light 265 (discussed in FIG. 2C) travels through air 294, media layer 290, and the device substrate 202 and then gets reflected by the reflective layer 260 out of the device substrate 202, into the media layer 290, and eventually into air 294. The image of the mark 235 may be detected by the reflected light. Air 294, the media layer 290, and the device substrate 202 each has an associated refractive index value, referred to as N1, N2, and N3, respectively. N1 (the refractive index value of air) is the smallest of N1, N2, and N3. N2 (the refractive index value of the media layer 290) is greater than N1 but smaller than N3 (the refractive index value of the device substrate 202). N3 is the greatest of N1, N2, and N3. In other words, N1<N2<N3. In the present embodiment, air has a refractive index value of about 1 and the device substrate 202 has a refractive index value of about 3.9. As mentioned above, the media layer 290 in the present embodiment includes an ultra-violet silicon nitride layer formed on a silicon oxide layer. The ultra-violet silicon nitride layer includes a refractive index value of about 1.9, and the silicon oxide layer includes a refractive index value of about 1.5. Thus the overall effective refractive index N2 of the media layer 290 still satisfies the N1<N2<N3 relationship.

Note that N1 and N3 are substantially fixed, since they represent the refractive index values of air 294 and the device substrate 202 (a silicon-based material in the present embodiment). At the same time, there is freedom to select the material composition for the media layer 290 so as to tune its refractive index value N2. One advantage of selecting N2 to be greater than N1 but less than N3 is that the aforementioned reflected light will have greater intensity, so that the image quality of the mark 235 is enhanced. To illustrate, light 265 has an angle of incidence 296 when it hits the interface between air 294 and the media layer 290. In accordance with Snell's law of refraction, light 265 will bend when it enters the media layer 290, such that the bent light 265A forms an angle of incidence 298 that satisfies the equation N1*sine(angle of incidence 296)=N2*sine(angle of incidence 298).

Since N1<N2, angle of incidence 298<angle of incidence 296. As a result, light 265A is more "vertical" when it enters the media layer 290 from air 294. For the same reasons, light 265A is bent again into light 265B when it enters the device substrate 202 from the media layer 290. When light 265B hits the reflective layer 260, it is reflected as light 265C. (Note that although light 265B travels inside not only the device substrate 202 but also the interconnect structure 240 below before being reflected by the reflective layer 260, this is ignored in the current illustration for the sake of simplicity). The reflected light 265C forms an same angle of incidence substantially equal to an angle of incidence formed by the light 265B. When the reflected light 265C hits the interface between the device substrate 202 and the media layer 290, a portion of the light 265C is reflected back and another portion goes through the media layer 290 and gets bent again, and thereafter gets bent one more time to become light 265D when it leaves the media layer 290. The reflected portion of the light 265C (reflected at the interface between the media layer 290 and the device substrate 202) is associated with a decrease in intensity of the light 265D, and the decrease in intensity correlates to the amount of light reflected. Eventually, light 265D travels outside of the media layer 290 and into air 294 and is detected by an outside light detector not shown in FIG. 2E.

The quality of the detected image of the mark 235 partially depends upon the intensity of light 265D. Thus, a smaller amount of reflected light at the interface between the media layer 290 and the device substrate 202 results in a better image of the mark 235. Since the difference between N2 and N3 is relatively small, the portion of the light 265C reflected at the interface between the device substrate 202 and the media layer 290 is also relatively small. Now contrast the present embodiment having a media layer 290 sandwiched between air 294 and the device substrate with a case where the media layer 290 is not used. In that case, the device substrate 202 directly forms an interface with air 294. There is a relatively big difference between the refractive index value N1 for air and the refractive index value N3 for the device substrate 202. Partially due to the relatively big difference between N1 and N3, a greater portion of the light 265C would have been reflected back towards the device substrate 202, and thus the intensity of light 265D that is detected by the outside light detector is less than the intensity of light 265D in the present embodiment. Therefore, an advantage of the present embodiment is that by adding a media layer 290 in between the device substrate 202 and air 294, where the media layer 290 has a refractive index value N2 less than N3 but greater than N1, the total reflection inside the image sensor device 200 is reduced. The reduction in total reflection in turn reduces the loss of intensity when light 265D is detected, consequently the detected image of the mark 235 has better contrast and is more discernable, which makes its detection easier. Thus, the media layer 290 reduces the reflection of light from the surface of the silicon substrate 202 and increases light contrast between the target 235 and its surrounding areas.

Figure 2F:
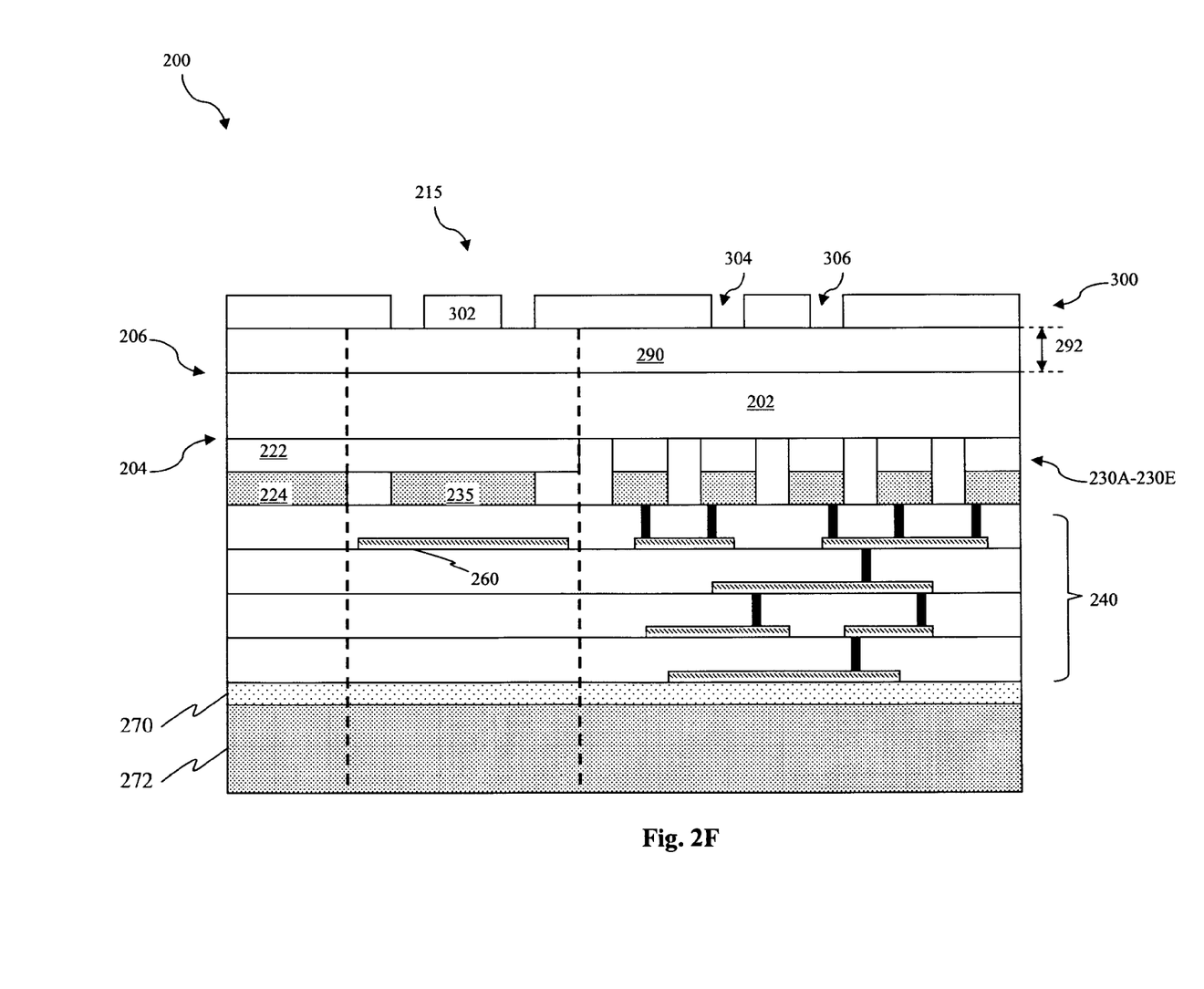

Referring to FIG. 2F, a patterned photoresist layer 300 is formed on the media layer 290. The patterned photoresist layer 300 may be formed by first depositing a photoresist layer on the media layer 290 and performing a photolithography process that includes various exposing, baking, and etching processes on the photoresist layer. The patterned photoresist layer 300 includes a mark 302 that is aligned with the mark 235. As discussed above, the alignment between the mark 302 and the mark 235 is referred to as overlay. Good overlay between the mark 302 and the mark 235 helps ensure good overlay among the various layers in the image sensor device 200 during other fabrication processes. For example, the patterned photoresist layer 300 includes openings 304 and 306, where an ion implantation process is performed through the openings 304 and 306 to form doped regions such as light sensing regions in the device substrate 202. These doped regions may require good overlay with one or more gates 230A-230E below. Good overlay between the doped regions in the device substrate and the gates 230A-230E is accomplished by ensuring the overlay between the marks 302 and 235 meets the necessary requirements. In addition, if after forming the mark 302, it is discovered that the overlay between the marks 302 and 235 is not good enough, a feed back process may be utilized to reduce the overlay error for future processes. For example, if the marks 302 and 235 have too great an offset, this offset may be fed back into later processes, and adjustments may be made in the later processes (such as for the next wafer) to take into account this offset. Thus a better overlay between the layers is achieved.

Figure 2G:
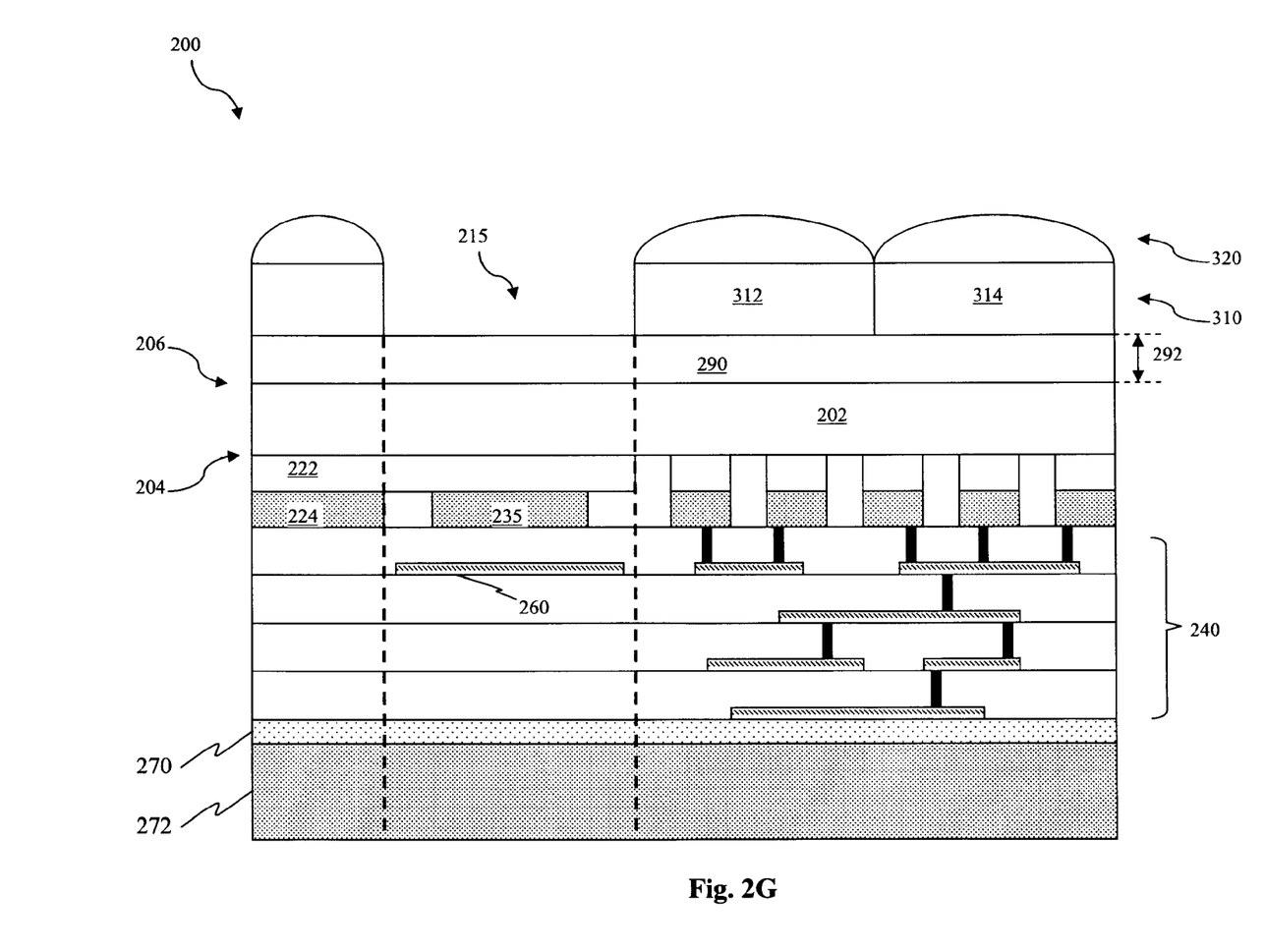

Referring now to FIG. 2G, the patterned photoresist layer 300 is removed by a process known in the art, such as an ashing or stripping process. A color filter layer 310 is then formed over the media layer 290. The color filter layer 310 can support different color filters (e.g., red, green, and blue), and may be positioned such that the incident light radiation is directed thereon and there through. For example, the color filter layer 310 includes a color filter 312 for filtering light radiation of a first wavelength and a color filter 314 for filtering light radiation of a second wavelength, so that light having different colors corresponding to the first and second wavelengths are filtered by the color filters 312 and 314, respectively. The color filters 312, 314 may include a dye-based (or pigment based) polymer or resin for filtering a specific wavelength band. A micro-lens layer 320 having a plurality of micro-lenses is then formed over the color filter layer 310 for directing and focusing light radiation towards the pixels in the device substrate 202. The lenses in the micro-lens layer 320 may be positioned in various arrangements and have various shapes depending on a refractive index of material used for the micro-lens and distance from a sensor surface. It is understood that the image sensor device 200 may also undergo another laser annealing process before the forming of the color filters. It should be noted that the process to correctly align the color filter layer and the micro-lens layer may be achieved in a similar manner as discussed above.

In summary, the methods and devices disclosed herein provide an effective and efficient approach for detecting an embedded target. The methods and devices disclosed herein take advantage of forming an embedded target in a semiconductor device, forming a reflective layer in the interconnect structure of the semiconductor device to reflect light, and forming a media layer between air and the semiconductor substrate, where the media layer has a refractive index value greater than the refractive index value of air but less than the refractive index value of the semiconductor substrate. In doing so, the present embodiment offers several advantages over prior art devices, it being understood that different embodiments may have different advantages and no particular advantage is necessarily required for all embodiments. One advantage of the present embodiment is that by using a media layer 290 that has a refractive index value in between the refractive index values of air and the semiconductor substrate, the amount of total reflection within the semiconductor device is reduced compared to the case where the media layer 290 is not formed. Consequently, the reflected light leaving the semiconductor device has less loss and better intensity when it is detected. Another advantage of the present embodiment is that the reflective layer in the interconnect structure reflects incoming light that defines the image of the target. As a result, the reflected light—when detected—has an increased intensity due to the light reflection. Yet another advantage of the present embodiment is that the reflective layer is formed using the same process that forms a conductive layer of the interconnect structure and needs no additional processing step. Furthermore, the steps outlined are compatible with a CMOS processing flow and are suitable for a VLSI (very-large-scale-integration) process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a device substrate having a front side and a back side, the device substrate having a first refractive index;

forming a gate layer over the front side of the device substrate, the gate layer having a gate electrode layer;

patterning the gate layer to form a plurality of gate structures, wherein an embedded target is formed by one of the gate structures, wherein the target is partially non-transparent;

forming a reflective layer over the embedded target;

forming a media layer over the back side of the device substrate, the media layer having a second refractive index less than the first refractive index; and projecting radiation through the media layer and the device substrate from the back side so that the embedded target is detected for a semiconductor process.

2. The method of claim 1, further including:

forming an interconnect structure over the gate layer, the interconnect structure having a plurality of metal layers;

bonding a carrier substrate to the front side of the device substrate; and thinning the device substrate from the back side.

3. The method of claim 2, wherein the embedded target has the same material composition as the gate electrode layer.

4. The method of claim 2, wherein forming the reflective layer is carried out in a same processing step that is used to form one of the metal layers.

5. The method of claim 1, wherein forming the embedded target includes forming the target within a scribe line region of the device substrate.

6. The method of claim 1, further including:

forming a further target on the back side of the device substrate; and registering the further target with the embedded target.

7. The method of claim 6, wherein forming the further target is carried out so that the further target includes a photoresist material.

8. The method of claim 1, wherein forming the media layer is carried out so that the second refractive index is greater than a refractive index of air.

9. The method of claim 1, wherein forming the media layer is carried out so that the media layer includes an oxide material and an ultra-violet nitride material.

10. A semiconductor device, comprising:

a device substrate having a front side and a back side, the device substrate having a first refractive index;

a gate layer formed over the front side of the device substrate;

an embedded target formed in the gate layer, wherein the target is operable to reflect light;

a reflective layer formed over the embedded target, the reflective layer being capable of reflecting radiation projected from the back side of the device substrate; and a media layer formed over the back side of the device substrate, the media layer having a second refractive index less than the first refractive index.

11. The semiconductor device of claim 10, further including:

an interconnect structure formed over the gate layer, the interconnect structure having a plurality of metal layers; and a carrier substrate bonded to the front side of the device substrate;

wherein the device substrate has a thickness less than about 10 um.

12. The semiconductor device of claim 11, wherein the gate layer includes a gate electrode layer, and wherein the embedded target and the gate electrode layer include a same material.

13. The semiconductor device of claim 11, wherein the reflective layer and one of the metal layers include a same material.

14. The semiconductor device of claim 10, wherein the target is formed within a scribe line region of the device substrate.

15. The semiconductor device of claim 10, further including a further target formed on the back side of the device substrate, wherein the further target is registered with the embedded target.

16. The semiconductor device of claim 15, wherein the further target includes a photoresist material.

17. The semiconductor device of claim 10, wherein the second refractive index is greater than a refractive index of air.

18. The semiconductor device of claim 10, wherein the media layer includes an oxide material and an ultra-violet nitride material.

19. A method of semiconductor fabrication, comprising:

providing a device substrate having a front side and a back side, the device substrate having a first refractive index and a scribe line region;

forming an embedded mark in a gate layer over the front side of the device substrate, the embedded mark being formed within the scribe line region;

forming a reflective layer within an interconnect structure;

bonding a carrier substrate to the front side of the device substrate;

thinning the device substrate from the back side;

forming a media layer over the back side of the thinned device substrate, the media layer having a second refractive index less than the first refractive index and greater than a refractive index of air; and projecting radiation through the media layer and the device substrate from the back side so that the embedded mark is detected for a semiconductor process.

20. The method of claim 19, further including:

after the forming of the media layer, forming a patterned photoresist layer on the media layer, the photoresist layer including a further mark within the scribe line region; and registering the further mark with the embedded mark by the projecting of the radiation.

\* \* \* \* \*